(12) United States Patent
Mizuno

(10) Patent No.: US 7,532,064 B2
(45) Date of Patent: May 12, 2009

(54) FSK DEMODULATOR CIRCUIT

(75) Inventor: Koutaro Mizuno, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 86 days.

(21) Appl. No.: 11/778,667

(22) Filed: Jul. 17, 2007

(65) Prior Publication Data
US 2008/0074181 A1  Mar. 27, 2008

(30) Foreign Application Priority Data
Sep. 21, 2006  (JP) .............................. 2006-255539

(51) Int. Cl.
H03D 3/00  (2006.01)
(52) U.S. Cl. ................... 329/300; 329/315; 714/775; 375/340; 375/343
(58) Field of Classification Search ............. 329/300, 329/315; 375/340, 343; 714/775
See application file for complete search history.

(56) References Cited

U.S. PATENT DOCUMENTS 5,465,405 A * 11/1995 Baseghi et al. ........... 455/226.4

6,618,450 B1 * 9/2003 Hatta ........................ 375/340

FOREIGN PATENT DOCUMENTS

JP  10-164151  6/1998
JP  11-298359  10/1999

OTHER PUBLICATIONS

Bijaki musen mojuru no kaihatsu no yoten (Toshiba TA32305FN) Key points in the development of a weak-signal wireless module—Toshiba TA32305TN).

* cited by examiner

Primary Examiner—Arnold Kinkead
(74) Attorney, Agent, or Firm—Volentine & Whitt, PLLC

(57) ABSTRACT

A demodulator circuit for demodulating a signal modulated by frequency shift keying discriminates the frequency of the signal to produce demodulated data. When the demodulated data match a known synchronization pattern, or are complementary to the known synchronization pattern, the demodulator circuit latches a value indicating whether the demodulated data match or are complementary to the synchronization pattern. If the latched signal indicates matching data, subsequent demodulated data are output as is. If the latched signal indicates complementary data, subsequent demodulated data are inverted and the inverted data are output. The output data are therefore correct even if the demodulated data are inverted.

6 Claims, 2 Drawing Sheets

FSK DEMODULATOR CIRCUIT

BACKGROUND OF THE INVENTION

1. Field of the Invention

The present invention relates to a demodulator for demodulating a signal modulated by frequency shift keying (FSK) and outputting the demodulated received data.

2. Description of the Related Art

In an FSK-modulated signal, '0' and '1' bits are represented by two different frequencies centered on a carrier frequency represent. A typical FSK receiver selects a desired channel from a range of high-frequency signals, converts the selected channel to an intermediate frequency, and discriminates between the '0' and '1' frequencies at the intermediate frequency level to obtain the received data. Conversion of the received FSK signal to the intermediate frequency (IF) signal can be effected as shown in FIG. 1, by use of a mixer 10 and a local oscillator 11 tuned to a frequency slightly above or below the channel carrier frequency.

Japanese Patent Application Publication No. 11-298359 describes a double-converter FSK receiver in which the received signal is converted using a first local oscillator with good stability over a wide frequency band, then converted again using a high-resolution second local oscillator that can be tuned within the tuning steps of the first-stage local oscillator.

A general problem in these conversion schemes is that there is a risk of reversing the logic of the data. Consider, for example, a carrier signal with a center frequency fc of 314.95 MHz, in which the frequency fc+30 kHz represents '1' and fc−30 kHz represents '0'. If this signal is down-converted to an intermediate frequency of 80 kHz by use of a local oscillator tuned to a lower local frequency fi of 314.87 MHz (80 kHz below fc), then after the conversion, '1' will be represented by 110 kHz and '0' by 50 kHz. If the same signal is down-converted to 80 kHz by use of a local oscillator tuned to an upper local frequency fi of 315.03 MHz (80 kHz above fc), then after the conversion, '1' will be represented by 80 kHz and '0' by 110 kHz. The logic levels in the demodulated data are accordingly reversed, depending on whether the local oscillator is tuned to a frequency above or below the carrier frequency.

SUMMARY OF THE INVENTION

An object of the present invention is to provide an FSK demodulator circuit that always demodulates an FSK signal to the correct logic levels, regardless of whether an upper local frequency or a lower local frequency is used.

An FSK demodulator circuit according to the present invention has a frequency discriminator that discriminates the frequency of an FSK signal, typically an intermediate frequency signal, to generate demodulated data. The signal includes a synchronization word having a known bit pattern. A correlator correlates the demodulated data with the known bit pattern of the synchronization word to generate a correlation signal, preferably generating a new correlation signal value as each bit of the demodulated data is output from the discriminator. A synchronization detector detects synchronization when the correlation signal indicates that the demodulated data match the synchronization word or are complementary to the synchronization word. When the synchronization detector detects synchronization, a decision circuit stores a decision signal that takes a first value to indicate that the demodulated data match the synchronization word and a second value to indicate that the demodulated data are complementary to the synchronization word. The decision circuit outputs the stored decision signal as further data are demodulated. If the stored decision signal has the first value, an output circuit outputs the demodulated data. If the stored decision signal has the second value, the output circuit inverts the demodulated data and outputs the inverted data.

If the discriminator demodulates the data correctly, the synchronization word in the demodulated data will match the known synchronization word, and the output circuit will output the demodulated data. If the discriminator inverts the logic levels of the demodulated data, the synchronization word in the demodulated data will be complementary to the known synchronization word, and the output circuit will invert the demodulated data. In either case, the output circuit outputs correctly demodulated data.

DETAILED DESCRIPTION OF THE INVENTION

Figure 1:
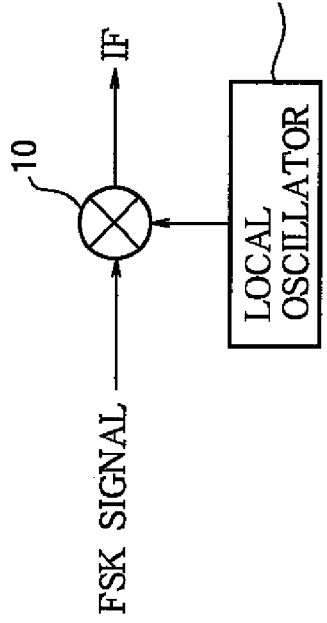
FIG. 1 is a block diagram of a frequency converter.

Embodiments of the invention will now be described with reference to the attached drawings, in which like elements are indicated by like reference characters.

The FSK demodulator circuit in both embodiments receives an FSK signal having a fixed transmission format that starts with a known unique synchronization word. This signal is down-converted to an intermediate frequency (IF) signal by a frequency converter such as the one shown in FIG. 1.

First Embodiment

Figure 2:
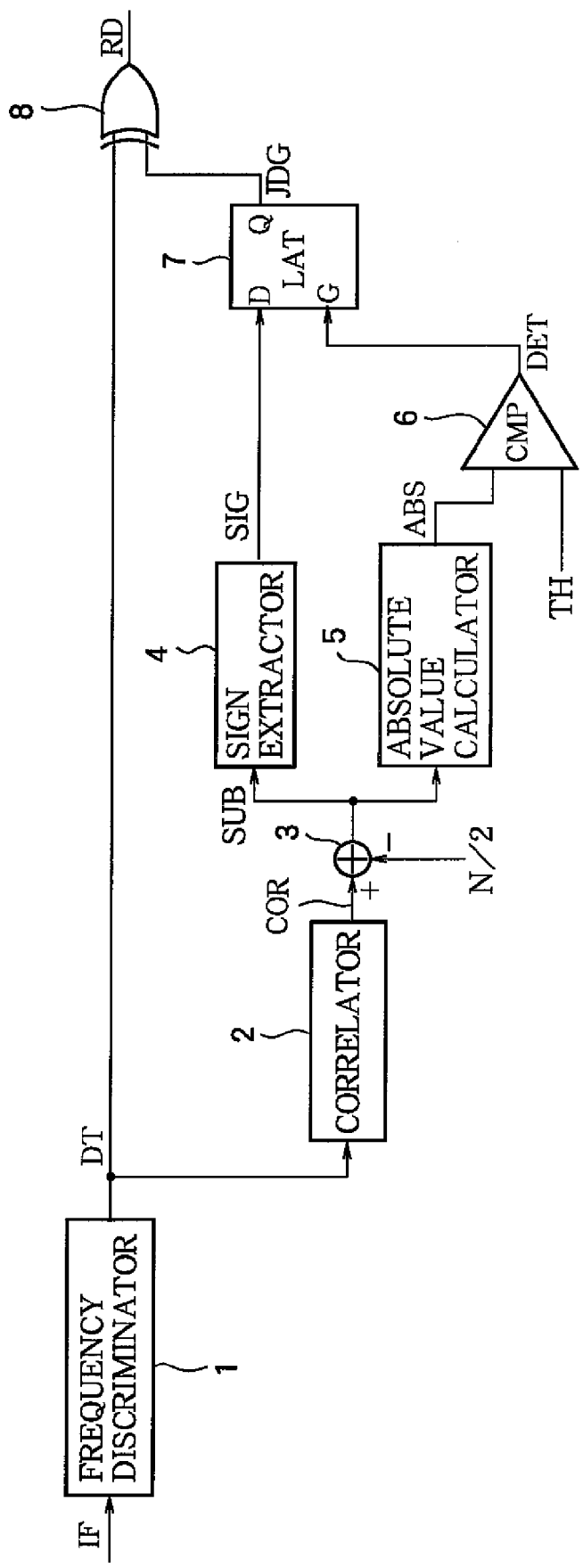
FIG. 2 is a block diagram of an FSK demodulator circuit according to a first embodiment of the invention.

Referring to FIG. 2, the FSK demodulator circuit in the first embodiment comprises a frequency discriminator 1, a correlator 2, a subtractor 3, a sign extractor 4, an absolute value calculator 5, a comparator (CMP) 6, a latch (LAT) 7, and an exclusive-OR gate 8.

The frequency discriminator 1 outputs demodulated data DT comprising successive bits with values of '0' and '1' depending on the frequency of the IF signal. For example, the frequency discriminator 1 outputs a '1' if the frequency of the IF signal is higher than a predetermined threshold frequency, and a '0' if the frequency of the IF signal is lower than the threshold frequency.

The correlator 2 is a well-known circuit comprising an N-bit register storing the known value of the synchronization word, where N is the bit length of the synchronization word (16 bits is a typical length). The correlator 2 also has an N-bit shift register that stores the most recent N bits of demodulated data DT, N comparators that compare corresponding bits in these two N-bit registers, and an arithmetic or logic circuit such as a cascaded string of N adders that determines the number of bit positions at which the contents of the two registers match. This number, which varies from zero to N, is output as a correlation signal COR.

The subtractor 3 subtracts a constant value equal to N/2 from the correlation signal COR to obtain a difference signal SUB, which takes on values from −N/2 to +N/2.

The sign extractor 4 extracts the sign bit from the difference signal SUB and outputs it as a one-bit signal SIG equal to '1' if SUB is negative and equal to '0' if SUB is positive or zero.

The absolute value calculator 5 takes the absolute value of the difference signal SUB and outputs it as an absolute value signal ABS.

The comparator 6 compares the absolute value signal ABS with a predetermined threshold TH and outputs a synchronization word detection signal DET having a value of '1' if the absolute value ABS exceeds the threshold value TH, and a value of '0' otherwise. The threshold TH should be slightly less than N/2. If N is sixteen, for example, an appropriate threshold value TH is six, so that the synchronization word is detected when the most recent N bits of the demodulated signal match the synchronization word in all bit positions or all but one bit position, or are complementary to the synchronization word in all bit positions or all but one bit position.

The latch 7 is a type of flip-flop circuit that receives the sign bit signal SIG at its data (D) input terminal and the detection signal DET at its gate (G) input terminal. When the detection signal DET is '1', the latch 7 outputs the received sign signal SIG from its non-inverting output terminal (Q) as a decision or judgement signal JDG. When the detection signal DET changes to '0', the latch 7 holds its existing output value and continues to output this value as long as the detection signal DET remains '0', regardless of any changes in the sign signal SIG.

The exclusive-OR gate 8 takes the exclusive logical OR of the demodulated signal DT and the decision signal JDG and outputs the result as a received data signal RD.

When the FSK demodulator circuit in FIG. 2 begins receiving an FSK signal, it starts by receiving the synchronization word. As the first N−1 bits of the synchronization word are discriminated by the frequency discriminator 1 and shifted into the correlator 2, the correlation signal COR takes on various values, fluctuating around N/2, because on the average, about half of the received data will match the synchronization word by chance. When the Nth bit of the synchronization word is received, however, if the frequency discriminator 1 is demodulating the IF signal correctly (i.e., if the intermediate frequency signal IF is generated by use of a local oscillator tuned to a lower local frequency), all N bits of demodulated data DT held in the correlator 2 will match the synchronization word, and the value of the correlation signal COR will suddenly become N. Conversely, if the frequency discriminator 1 is reversing the logic levels of the demodulated data DT (i.e., if the local oscillator is tuned to an upper local frequency), all N bits of demodulated data DT held in the correlator 2 will be complementary to the corresponding bits in the synchronization word, and the value of the correlation signal COR will suddenly become zero.

In the first case, in which the demodulated data DT are correct, when the last bit of the synchronization word is received, the difference signal SUB jumps from a value near zero to a value of N/2, generating a sign signal SIG with a value of '0' and an absolute value signal ABS with a value of N/2. The absolute value signal ABS exceeds the threshold value TH, so the detection signal DET output by the comparator 6 goes to '1' and the latch 7 outputs the '0' value of the sign bit as the decision signal JDG. The exclusive-OR gate 8 takes the exclusive logical OR of the last bit of the synchronization word and '0' decision signal JDG, and outputs the unaltered value of the last bit of the synchronization word as received data RD, since the exclusive logical OR of any bit with '0' is the unaltered value of the bit.

When the next bit is demodulated and shifted into the shift register in the correlator 2, the correlation signal reverts to a value near N/2, the difference signal SUB reverts to a value near zero, and its absolute value ABS reverts to a positive number near zero, less than the threshold value TH. The detection signal DET accordingly changes from '1' to '0', causing the latch 7 to store and continue to output the previous sign value '0' as the decision signal JDG. The exclusive-OR gate 8 therefore outputs the unaltered bit of demodulated data DT as the received data RD.

As further bits of data are demodulated, since they are not part of the synchronization word, the correlation signal COR continues to fluctuate around N/2, the difference signal SUB continues to take on values near zero, the detection signal DET remains '0', and the decision signal JDG remains at the latched value of '0'. Consequently, the exclusive-OR gate 8 continues to output the demodulated data DT as the received data RD.

In the second case, in which the demodulated data DT are inverted, when the last bit of the synchronization word is received, the correlation signal COR is zero as noted above, the difference signal SUB has a value of −N/2, and the value of the sign signal SIG is '1'. The absolute value ABS of the difference signal is again N/2, exceeding the threshold value TH, so the detection signal DET output by the comparator 6 goes to '1' and the latch 7 outputs the '1' value of the sign signal. The exclusive-OR gate 8 takes the exclusive logical OR of the last bit of the synchronization word and '1' and outputs the inverted value or complement of the last bit of the synchronization word, because the exclusive logical OR of any bit with '1' is the complement of the bit value.

When the next bit is demodulated and shifted into the shift register in the correlator 2, the correlation signal reverts to a value near N/2, the difference signal SUB reverts to a value near zero, and its absolute value ABS reverts to a positive number near zero, less than the threshold value TH. The detection signal '0' changes from '1' to '0', causing the latch 7 to store and continue to output the previous sign bit value '1' as the decision signal JDG. The exclusive-OR gate 8 therefore outputs the complementary value of the demodulated data bit DT as the received data RD.

As further bits of data are demodulated, since they are not part of the synchronization word, the correlation signal COR remains near N/2, the difference signal SUB remains near zero, the detection signal DET remains '0', and the decision signal JDG remains at the latched value of '1'. Consequently, the exclusive-OR gate 8 continues to invert the demodulated data DT and output the complementary bit values as the received data RD.

Accordingly, regardless of whether a lower local frequency is used, causing the frequency discriminator 1 to demodulate the IF signal correctly, or an upper local frequency is used, causing the frequency discriminator 1 to invert the demodulated data, starting with the last bit of the synchronization word, the exclusive-OR gate 8 outputs the correct bit values as the received data RD.

If the length N of the synchronization word is sixteen bits and threshold value TH is six, then the synchronization word will be detected even if one of its bits is received incorrectly due to poor transmission channel conditions. More generally, setting the threshold value TH to N/2−M enables the first embodiment to tolerate up to (M−1)-bit errors in the synchronization word.

Second Embodiment

Figure 3:
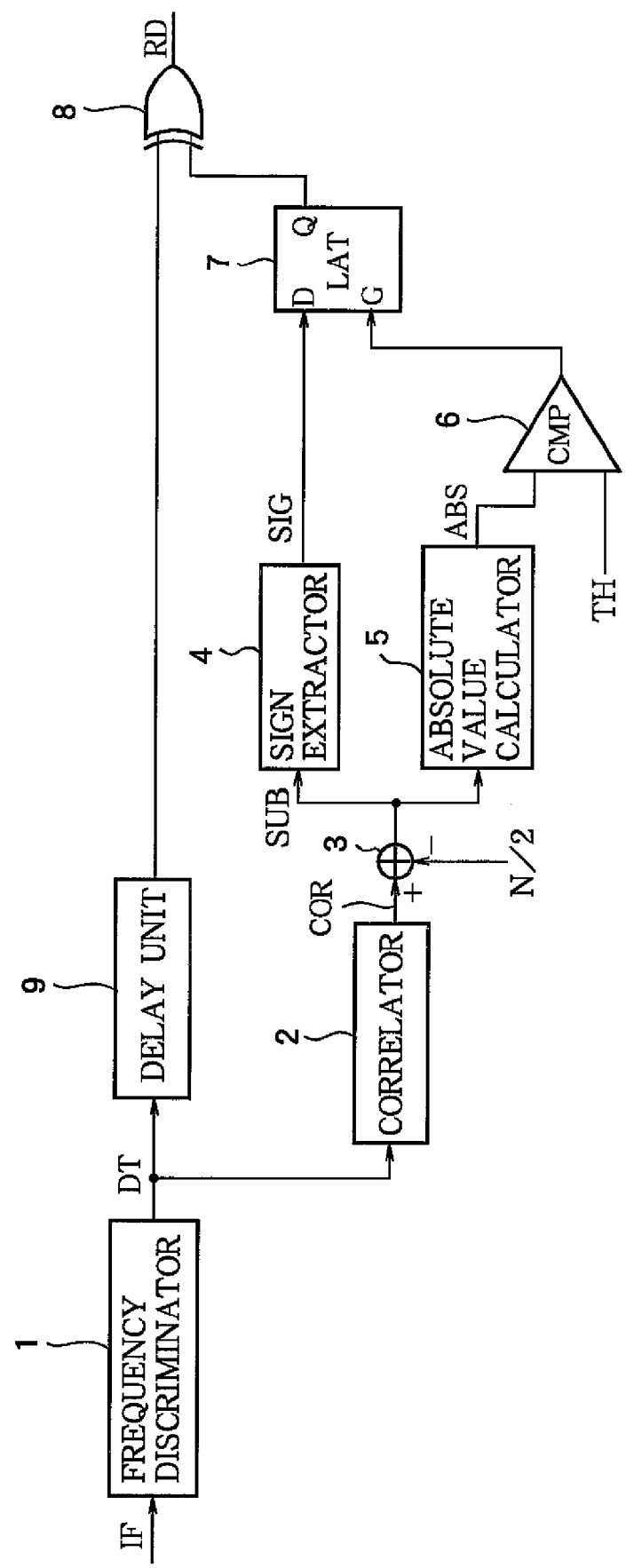
FIG. 3 is a block diagram of an FSK demodulator circuit according to a second embodiment of the invention.

Referring to FIG. 3, the second embodiment inserts a delay unit 9 between the frequency discriminator 1 and exclusive-OR gate 8 of the first embodiment. The delay unit 9 delays the demodulated data DT by N bits, where N is the bit length of the synchronization word. In other respects, the second embodiment is identical to the first embodiment.

The second embodiment operates in the same way as the first embodiment, except that the exclusive-OR gate 8 does not receive the first bit of the synchronization word until the correlator 2 has already received the last bit of the synchronization word. Accordingly, when the exclusive-OR gate 8 processes the first bit of the synchronization word, the latch 7 has already latched the sign signal SIG that indicates whether the demodulated data DT are being demodulated correctly or are inverted. The exclusive-OR gate 8 therefore outputs correct received data RD for the synchronization word as well as for the subsequent data.

In a variation of the second embodiment, the delay unit 9 delays the demodulated data by more than the bit length N of the synchronization word. This variation is useful with data formats in which the synchronization word is preceded by other header information. To enable the header information to be received correctly, the delay unit 9 may be adapted to delay the demodulated data DT by an amount equal to the sum of the length of the synchronization word and the length of the preceding header information.

The threshold value TH in the first and second embodiments should be selected according to the conditions and requirements of the system in which the demodulator circuit is used. Raising the threshold value reduces the probability of false positive detection of the synchronization word (detection of a synchronization word when none was transmitted), but increases the probability of false negative detection (failure to detect a transmitted synchronization word).

Although the first and second embodiments have been described as hardware circuits, the functions of some or all of the elements of these embodiments may be implemented in software.

The invention is not limited to use of the frequency converter shown in FIG. 1. Any type of frequency converter may be used.

Those skilled in the art will recognize that further variations are possible within the scope of the invention, which is defined in the appended claims.

What is claimed is:

1. A demodulator circuit for demodulating a signal modulated by frequency shift keying (FSK), comprising:
   a frequency discriminator for discriminating frequencies of the signal modulated by frequency shift keying to generate demodulated data;
   a correlator for correlating the demodulated data with a predetermined synchronization word to obtain a correlation signal;
   a synchronization detector that detects the synchronization word when the correlation signal indicates that the demodulated data match the synchronization word, and also detects the synchronization word when the correlation signal indicates that the demodulated data are complementary to the synchronization word;
   a decision circuit for storing a decision signal when the synchronization detector detects the synchronization word, the decision signal having a first value indicating that the demodulated data match the synchronization word and a second value indicating that the demodulated data are complementary to the synchronization word; and
   an output circuit for outputting the demodulated data if the stored decision signal has the first value, and for inverting the demodulated data to obtain complementary data and outputting the complementary data if the stored decision signal has the second value.

2. The demodulator circuit of claim 1, wherein the signal modulated by frequency shift keying is an intermediate frequency signal obtained by conversion of a higher-frequency signal.

3. The demodulator circuit of claim 1, wherein, when the frequency discriminator produces each bit of the demodulated data, the correlator updates the correlation signal to indicate a correlation between the synchronization word and a most recent part of the demodulated data equal in length to the synchronization word.

4. The demodulator circuit of claim 1, further comprising a delay circuit for delaying the demodulated data by at least a length of the synchronization word and supplying the delayed data to the output circuit.

5. The demodulator circuit of claim 1, wherein the correlation signal has a maximum value indicating a perfect match between the demodulated data and the synchronization word, and the synchronization detector comprises:
   a subtractor for subtracting half the maximum value from the correlation signal to obtain a difference signal;
   an absolute value calculator for calculating an absolute value of the difference signal; and
   a comparator for comparing the absolute value with a threshold value and generating a synchronization word detection signal.

6. The demodulator circuit of claim 5, wherein the decision circuit comprises:
   a sign extraction circuit for extracting a sign bit from the difference signal; and
   a latch for latching the sign bit responsive to the synchronization word detection signal.

* * * * *